(12) United States Patent
    Hool (10) Patent No.: US 9,679,861 B1
(45) Date of Patent: Jun. 13, 2017

(54) INTEGRATED CIRCUIT PACKAGE WITH ACTIVE WARPAGE CONTROL PRINTED CIRCUIT BOARD MOUNT

(71) Applicant: Altera Corporation, San Jose, CA (US)

(72) Inventor: Vincent Hool, Pleasanton, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 15/080,428

(22) Filed: Mar. 24, 2016

(51) Int. Cl.
  *H01L 23/48* (2006.01)
  *H01L 23/00* (2006.01)
  *H01L 21/52* (2006.01)

(52) U.S. Cl.
  CPC ............... *H01L 24/14* (2013.01); *H01L 21/52* (2013.01); *H01L 24/11* (2013.01); *H01L 24/81* (2013.01); *H01L 2224/1403* (2013.01); *H01L 2224/14142* (2013.01); *H01L 2224/14179* (2013.01); *H01L 2224/81815* (2013.01)

(58) Field of Classification Search
  CPC ........... H01L 24/14; H01L 24/11; H01L 24/81
  USPC ........................................................ 257/738
  See application file for complete search history.

(56) References Cited

U.S. PATENT DOCUMENTS

| 7,269,813 | B2 | 9/2007 | Brown |
| 7,602,615 | B2 | 10/2009 | Chan et al. |
| 8,169,067 | B2 | 5/2012 | Law et al. |
| 2011/0001230 | A1 | 1/2011 | Li et al. |
| 2013/0175684 | A1 | 7/2013 | Rhyner et al. |

OTHER PUBLICATIONS

U.S. Appl. No. 14/069,240 filed Oct. 31, 2013.

*Primary Examiner* — Anthony Ho (57) ABSTRACT

An integrated circuit package may include a package substrate having a surface, first interconnects of a first size that are arranged in a substantially circular shape that is centered on the surface of the package substrate, and second interconnects of a second size that is different from the first size, where the second interconnects are arranged in a ring shape on the surface of the package substrate. The ring shape of the second interconnects is concentric with the substantially circular shape of the first interconnects. The integrated circuit package may further include third interconnects of a third size that are arranged in peripheral corner regions on the surface of the package substrate. The third size may be smaller or bigger than at least one of the first and second sizes.

20 Claims, 6 Drawing Sheets

INTEGRATED CIRCUIT PACKAGE WITH ACTIVE WARPAGE CONTROL PRINTED CIRCUIT BOARD MOUNT

FIELD OF THE DISCLOSURE

The present disclosure relates to electronic integrated circuit packages, and more particularly, to integrated circuit packages with active warpage control printed circuit board (PCB) mount.

BACKGROUND

In an integrated circuit (IC) package assembly, a semiconductor die (also referred to as an integrated circuit (IC) chip or "chip") may be bonded directly to a package substrate. Such die is formed with interconnects (e.g., solder balls) affixed to its input/output (I/O) bonding pads. During conventional packaging assembly, the die is "flipped" onto its front surface (e.g., active circuit surface) so that the solder bumps form electrical and mechanical connections directly between the die and conductive metal pads on the package substrate.

One concern is that when such an IC package is soldered or otherwise electrically connected to a printed circuit board (PCB), the IC package is subjected to different temperatures during the assembly process. As a result, stresses are built up among package materials (e.g., die, package substrate, bonding materials, etc.) having different coefficients of thermal expansion (CTE) as each package material tends to expand and contract differently.

The CTE difference in die, substrate, and bonding materials may cause the package to warp or bow (e.g., in a concave shape or a convex shape) during temperature excursion, and this warping or bowing may adversely affect the board level reliability of the package. In some cases, the warping of the package may exceed the co-planarity specification for the IC package. Excessive warpage of the IC package may prevent the mounting of the package substrate to the PCB and is one of many factors that cause low interconnect joint yields.

SUMMARY

In accordance with the present invention, apparatuses and methods are provided for creating integrated circuit packages with active warpage control interconnects.

The present invention can be implemented in numerous ways, such as a process, an apparatus, a system, or a device. Several embodiments of the present invention are described below.

In an embodiment, an integrated circuit package is disclosed. The integrated circuit package includes a package substrate having a surface, first interconnects of a first size that are arranged in a substantially circular shape that is centered on the surface of the package substrate, and second interconnects of a second size that is different from the first size, where the second interconnects are arranged in a ring shape on the surface of the package substrate. The ring shape of the second interconnects is concentric with the substantially circular shape of the first interconnects. The integrated circuit package further includes third interconnects of a third size that are arranged in peripheral corner regions on the surface of the package substrate. The third size may be smaller or bigger than at least one of the first and second sizes.

In another embodiment, another integrated circuit package is disclosed. The integrated circuit package includes a package substrate having a top surface and a bottom surface, a first array of interconnects disposed in a first ring-shaped region on the bottom surface of the package substrate, and a second array of interconnects disposed in a second ring-shaped region on the bottom surface of the package substrate, where the second ring-shaped region surrounds the first ring-shaped region. The first array of interconnects has a first height, and the second array of interconnects has a second height that is different than the first height. The integrated circuit package further includes a third array of interconnects disposed in a center circular region on the bottom surface of the package substrate, in which the first and second ring-shaped regions are concentric to the center circular region. Each interconnect of the third array of interconnects has a third height that is different from at least one of the first and second heights. The first, second, and third arrays of interconnects actively control warpage of the package substrate during a reflow process of the integrated circuit package.

As a further embodiment, a method for manufacturing an integrated circuit package is disclosed. The method includes forming a first group of interconnects arranged in a circular shape on a bottom surface of a package substrate, forming a second group of interconnects arranged in a ring shape on the bottom surface of the package substrate, where the ring shape is concentric to the circular shape. Each interconnect in the first group of interconnects has a first size, and each interconnect in the second group of interconnects has a second size that is different from the first size. The method further includes mounting the integrated circuit package on a printed circuit board, wherein the integrated circuit package is electrically coupled to the groups of interconnects. In this scenario, each of the first and second groups of interconnects actively controls warpage that occurs between the package substrate and the printed circuit board during a reflow process on the integrated circuit package.

Further features of the invention, its nature, and various advantages will be more apparent from the accompanying drawings and the following detailed description of the preferred embodiments.

DETAILED DESCRIPTION

The embodiments provided herein include integrated circuit structures and packaging techniques for creating an integrated circuit package with active warpage control printed circuit board (PCB) mount.

Figure 1:
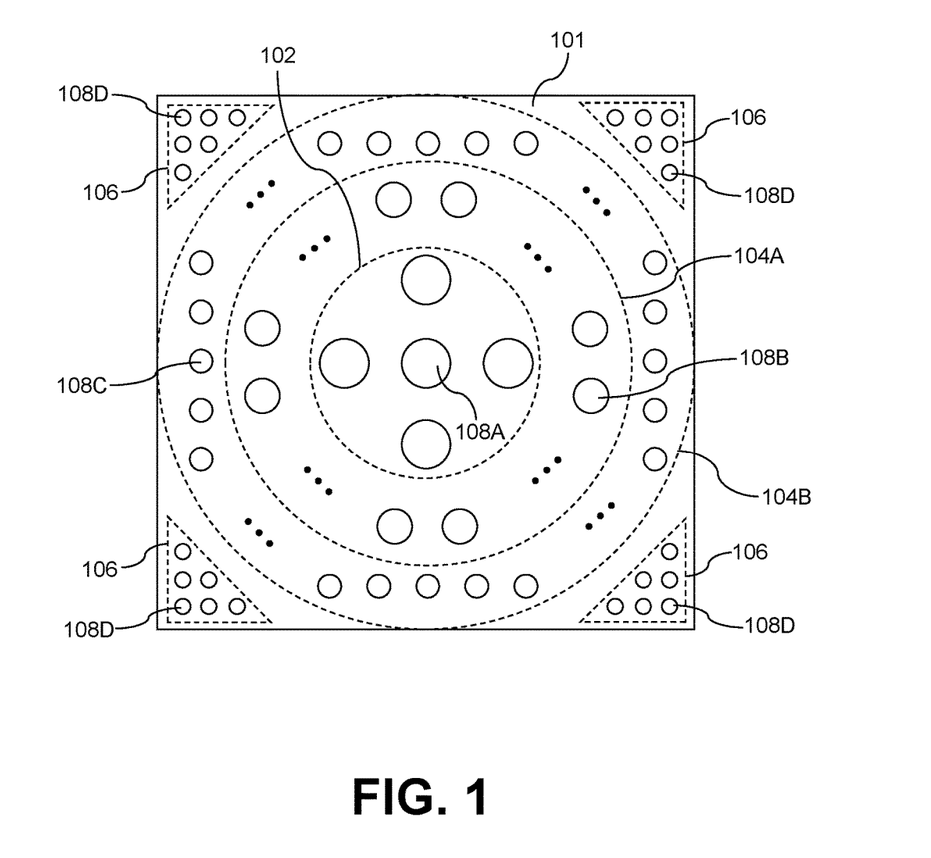
FIG. 1 shows a top view of an illustrative package substrate in accordance with one embodiment of the present invention.

FIG. 1 shows a top view of an illustrative package substrate 101 with different interconnect arrangements in accordance with one embodiment of the present invention.

Package substrate 101 includes interconnects of different sizes (e.g., interconnects 108A, 108B, 108C, and 108D) arranged in a respective shape on a surface of package substrate 101. For example, interconnects 108A, 108B, 108C, and 108D may be solder balls. In one embodiment, package substrate 101 may have square form factor (i.e., size and/or shape). In another embodiment, package substrate 101 may have a round form factor.

As shown in FIG. 1, a group of interconnects 108A of a first size (e.g., about 1.0 mm in diameter) is arranged in a substantially circular shape (highlighted in region 102) that is centered on the surface of package substrate 101. Accordingly, a group of interconnects 108B of a second size (e.g., about 0.95 mm in diameter) is arranged in a ring shape (highlighted in region 104A) on the surface of package substrate 101, in which the ring shape of interconnects 108B is concentric to the circular shape of interconnects 108A. If desired, another group of interconnects 108C of a third size (e.g., about 0.9 mm in diameter) may be arranged in an additional ring shape (highlighted in region 104B) that extends laterally from the ring shape of interconnects 108B, in which the additional ring shape is concentric with the circular shape of interconnects 108A. In the case where the form factor of package substrate 101 is square, interconnects that are arranged in a ring shape may be broken by the square package substrate form factor. For example, as shown in FIG. 1, a group of interconnects 108D of a fourth size (e.g., about 0.85 mm in diameter) may be arranged in peripheral corner regions (highlighted in regions 106) on the surface of package substrate 101 having square form factor. Alternatively, if the form factor of package substrate 101 is round, the arrangement of interconnects 108D is a complete ring (not shown) that extends laterally from the ring shape of interconnects 108C. The size of the interconnects may refer, for example, to the diameter, the height, the circumference, or the volume of the interconnects.

When interconnects of different sizes are arranged in different shapes on the surface of package substrate 101, a significant standoff height between these interconnects may be formed. The different standoff heights formed by the different size interconnects may be used to actively control warpage (or coplanarity) when package substrate 101 is soldered or otherwise electrically connected to a printed circuit board (PCB) during a surface mount reflow process. The sizes and arrangements of interconnects 108A, 108B, 108C, and 108D may correspond to a warpage behavior or characteristic (e.g., concave warpage or convex warpage) of package substrate 101 that occurs due to various thermal excursions in the PCB assembly. It should be appreciated that warpage simulation and/or analysis based on understanding of package materials may be performed prior to the fabrication of interconnects 108A, 108B, 108C, and 108D. It should also be appreciated that any conventional structural analysis method may be employed to predict or simulate the warpage of package substrate 101.

Figure 2:
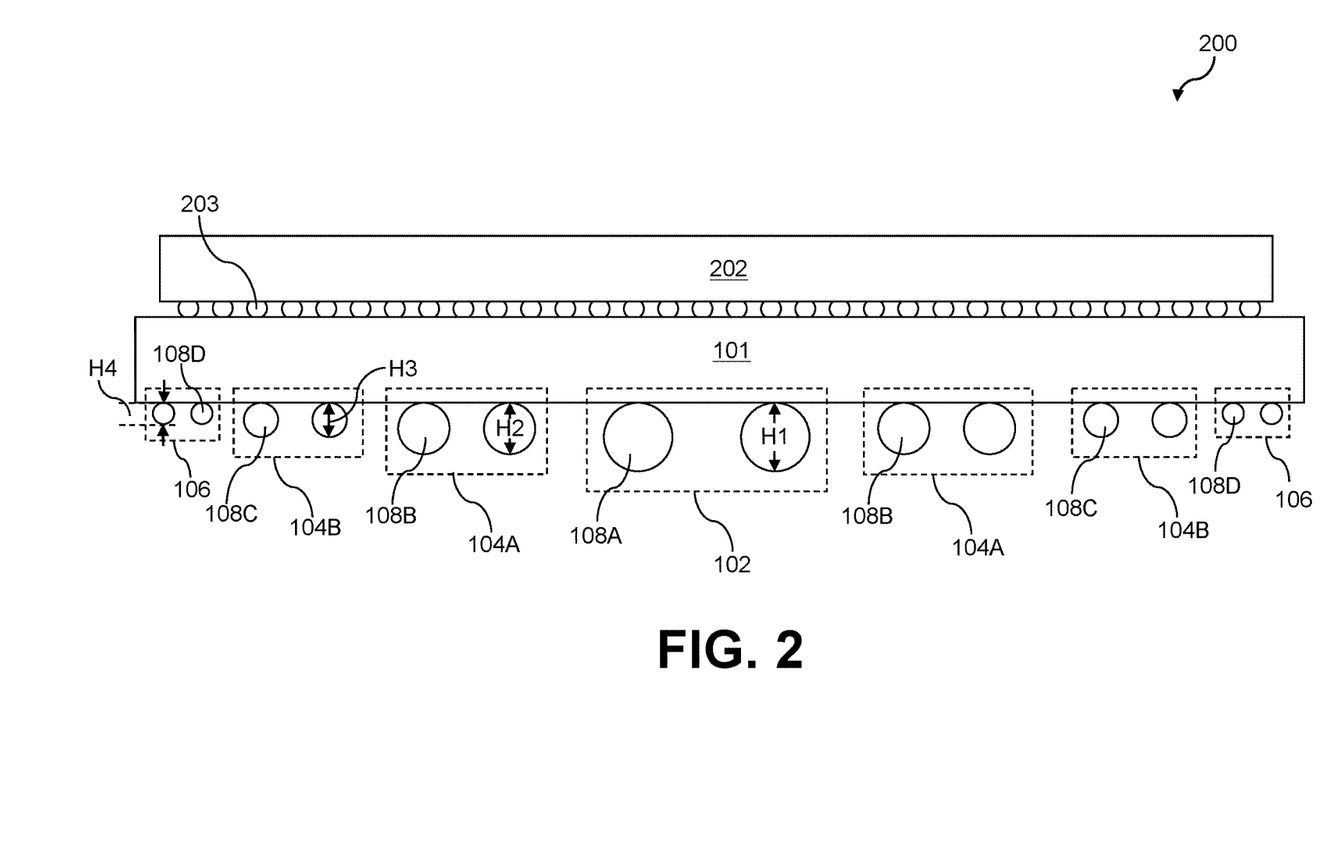
FIG. 2 shows a cross-sectional view of an illustrative integrated circuit package in accordance with one embodiment of the present invention.
Figure 3:
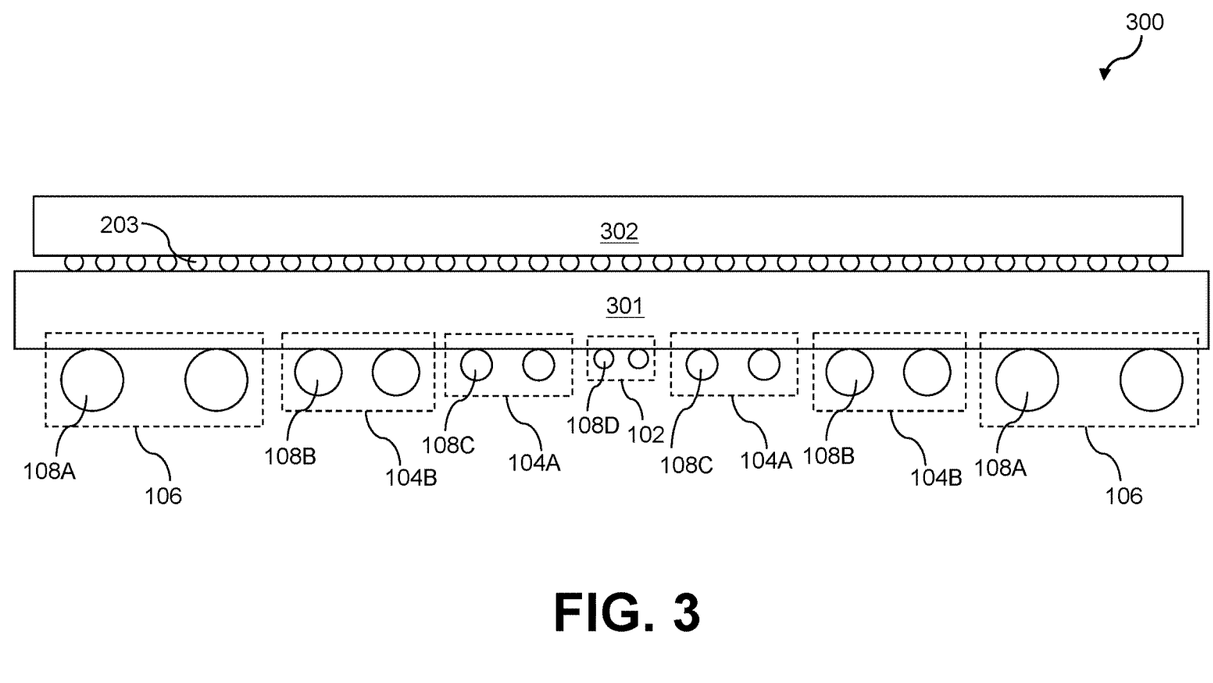
FIG. 3 shows a cross-sectional view of another illustrative integrated circuit package in accordance with one embodiment of the present invention.

FIGS. 2 and 3 show cross-sectional views of integrated circuit (IC) packages 200 and 300 in accordance with embodiments of the present invention. As shown in FIG. 2, IC package 200 includes an IC die (e.g., IC die 202) mounted on a top surface of package substrate 101 through bumps 203. Accordingly, multiple interconnects (e.g., interconnects 108A, 108B, 108C, and 108D) are formed and arranged in different shapes (e.g., highlighted in regions 102, 104A, 104B, and 106 of FIG. 1) on a bottom surface of package substrate 101. Similarly, as shown in FIG. 3, IC package 300 includes an IC die (e.g., IC die 302) mounted on a top surface of package substrate 301 through bumps 203. Package substrate 301 is similar to package substrate 101, in which there are multiple interconnects (e.g., interconnects 108A, 108B, 108C, and 108D) formed and arranged in different shapes (e.g., highlighted in regions 102, 104A, 104B, and 106) on a bottom surface of package substrate 301.

In one embodiment, each of interconnects 108A, 108B, 108C, and 108D may have a predefined size to achieve standoff height variation. For example, as shown in FIG. 2, interconnects 108A may have a height H1, interconnects 108B may have height H2, interconnects 108C may have height H3, and interconnects 108D may have height H4. Height H1 may be, for example, about 1.0 mm. Height H2 may be, for example, about 0.95 mm. Height H3 may be, for example, about 0.9 mm. Height H4 may be, for example, about 0.85 mm.

During a surface mount reflow process (or soldering process), an IC package may be electrically connected to a printed circuit board (PCB). In this process, the IC package may be subjected to different temperatures, which arise with the cool down during surface mount reflow. As a result, the IC package is highly stressed due to the different coefficients of thermal expansion (CTE) of different components (e.g., package substrate, IC die, etc.) in the IC package. The high stress experienced by bonded materials' CTE mismatch during cooling may cause the structure of the IC package to warp or bow, either downwardly or upwardly.

In order to actively control warpage during a printed circuit board (PCB) assembly (i.e., when an IC package is soldered or otherwise electrically connected to the PCB), different size interconnects may be arranged in different shapes on a bottom surface of a package substrate of the IC package. Each interconnect size and arrangement shape may correspond to a corresponding warpage height, which may vary from the center to the peripheral corners of the IC package.

For example, as shown in FIG. 2, assume that IC package 200 has a warpage characteristic that is concave (i.e., bow downwardly) after the surface mount reflow process. This means that the center region at the bottom of IC package 200 may exhibit a higher warpage standoff height than the circumferential and peripheral corner regions of IC package 200. In this scenario, large interconnects such as interconnects 108A may be arranged in a substantially circular shape (highlighted in region 102) on the bottom surface of package substrate 101 to correspond to the warpage standoff height in the center area of IC package 200, medium interconnects such as interconnects 108B and 108C may be arranged in ring shapes (highlighted in regions 104A and 104B) that are concentric to the circular shape on the bottom surface of package substrate 101 to correspond to the warpage standoff height in the circumferential area of IC package 200, and small interconnects such as interconnects 108D may be arranged in peripheral corners (highlighted in regions 106) on the bottom surface of package substrate 101 to correspond to the warpage standoff height in the corner area of IC package 200. Such arrangements may achieve optimized uniform interconnect standoff heights between package substrate 101 and IC die 202 in IC package 200 in order to maintain low interconnect stress and create high quality interconnect joint.

In another example, as shown in FIG. 3, assume that IC package 300 has a warpage characteristic that is convex (i.e., bow upwardly) after the surface mount reflow process. This means that the center region at the bottom of IC package 300 may exhibit a lower warpage standoff height than the circumferential and peripheral corner regions of IC package 300. In this scenario, small interconnects such as interconnects 108D may be arranged in a substantially circular shape (highlighted in region 102) on the bottom surface of package substrate 301 to correspond to the warpage standoff height in the center area of IC package 300, medium interconnects such as interconnects 108B and 108C may be arranged in ring shapes (highlighted in regions 104A and 104B) that are concentric to the circular shape on the bottom surface of package substrate 301 to correspond to the warpage standoff height in the circumferential area of IC package 300, and large interconnects such as interconnects 108A may be arranged in peripheral corners (highlighted in regions 106) on the bottom surface of package substrate 301 to correspond to the warpage standoff height in the corner area of IC package 300. Such arrangements may achieve optimized uniform interconnect standoff heights between package substrate 301 and IC die 302 in IC package 300 in order to maintain low interconnect stress and create high quality interconnect joint.

Figure 4:
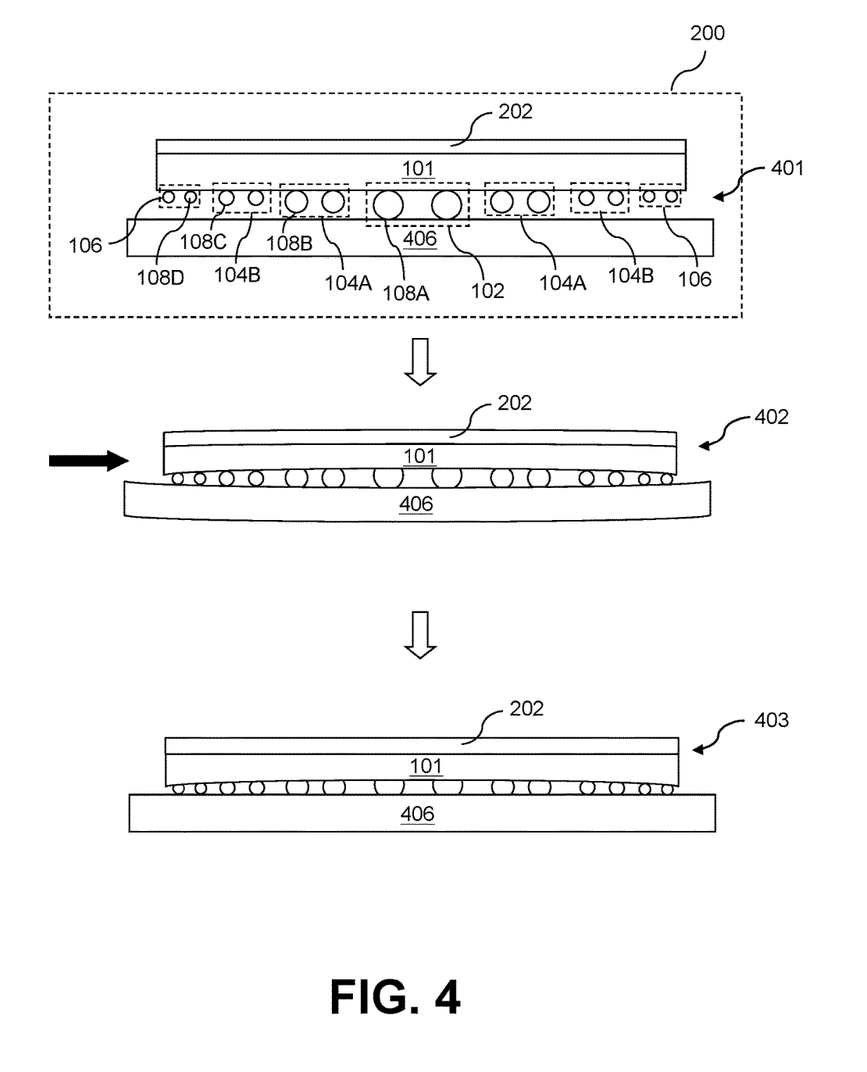
FIG. 4 shows a diagram of the illustrative integrated circuit package of FIG. 2 during a surface mount reflow process in accordance with an embodiment of the present invention.

FIG. 4 shows a diagram of a sequence of steps used to manage warpage in IC package 200 of FIG. 2 during a surface mount reflow process in accordance with one embodiment of the present invention. It should be appreciated that for the sake of brevity, components already shown in IC package 200 (e.g., IC die 202 and bumps 203) and described above will not be repeated.

As shown in step 401, IC package 200 is mounted on a printed circuit board (e.g., PCB 406) using package mounting tools. Prior to the package mounting process, different size interconnects (e.g., interconnects 108A, 108B, 108C, and 108D) may be formed and arranged in different shapes on a bottom surface of package substrate 101. As described above in FIGS. 1 and 2, large interconnects 108A may be arranged in a substantially circular shape (highlighted in region 102) that is centered on the bottom surface of package substrate 101, medium interconnects 108B and 108C may be arranged in ring shapes (highlighted in regions 104A and 104B, respectively) that are concentric to the circular shape on the bottom surface of package substrate 101, and small interconnects 108D are arranged in peripheral corners (highlighted in region 106) on the bottom surface of package substrate 101.

At step 402, IC package 200 undergoes a reflow process so that IC package 200 is mechanically and electrically connected to PCB 406 by interconnects 108A, 108B, 108C, and 108D. In this step, the reflow is performed to melt interconnects 108A, 108B, 108C, and 108D, so that IC package 200 and PCB 406 are bonded together when the interconnects cool down. During the reflow process, IC package 200 may exhibit a concave warpage behavior in response to thermal heat exposure at reflow.

As IC package 200 is cooled from the reflow temperature to room temperature, IC package 200 may still exhibit the concave warpage behavior at step 403. However, the different arrangements of the different size interconnects 108A, 108B, 108C, and 108D from the center to the corner regions on the bottom surface of package substrate 101 create an optimized and uniform interconnect height between IC package 200 and PCB 406. The optimized and uniform interconnect height between IC package 200 and PCB 406 maintains low interconnect stress and improves interconnect joint yields.

Figure 5:
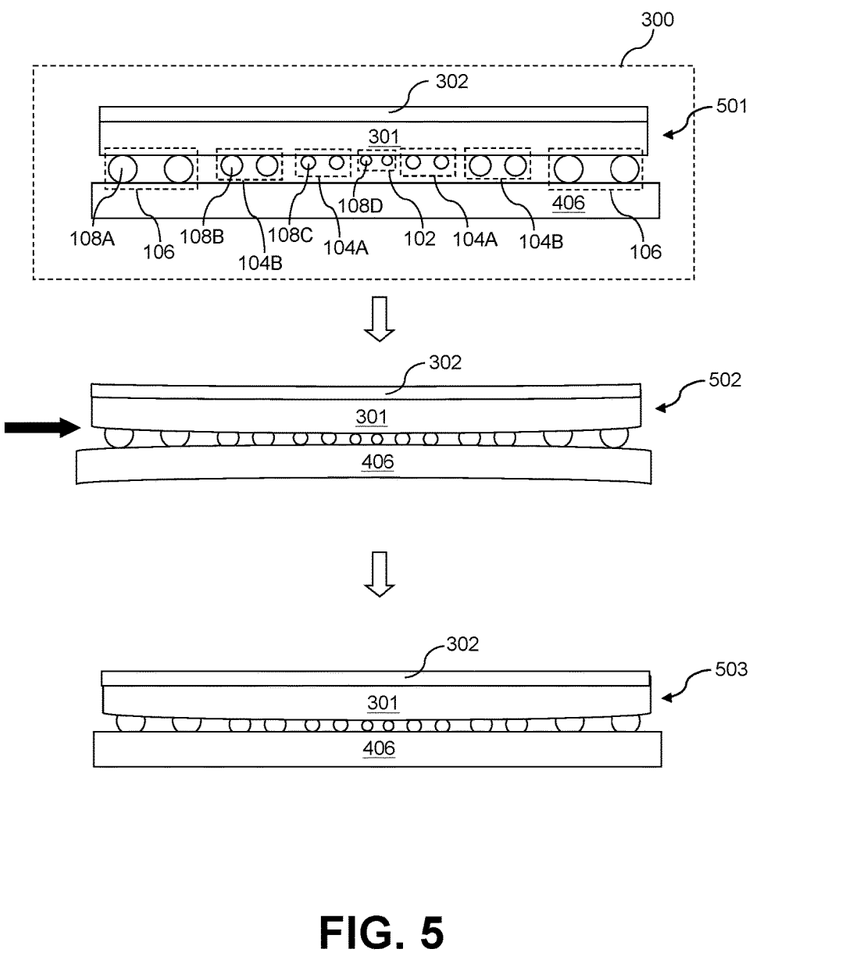
FIG. 5 shows a diagram of the illustrative integrated circuit package of FIG. 3 during a surface mount reflow process in accordance with one embodiment of the present invention.

FIG. 5 shows a diagram of a sequence of steps used to manage warpage in integrated circuit package 300 of FIG. 3 during a surface mount reflow process in accordance with one embodiment of the present invention. It should be appreciated that for the sake of brevity, components already shown in IC package 300 (e.g., IC die 302 and bumps 203) and described above will not be repeated.

As shown in step 501, IC package 300 is mounted on a printed circuit board (e.g., PCB 406) using package mounting tools. Prior to the package mounting process, different size interconnects (e.g., interconnects 108A, 108B, 108C, and 108D) may be formed and arranged in different shapes on a bottom surface of package substrate 301. As described above in FIG. 3, small interconnects 108D may be arranged in a substantially circular shape (highlighted in region 102) that is centered on the bottom surface of package substrate 101, medium interconnects 108B and 108C may be arranged in ring shapes (highlighted in regions 104B and 104A, respectively) that is concentric to the circular shape on the bottom surface of package substrate 301, and large interconnects 108A are arranged in peripheral corners (highlighted in region 106) on the bottom surface of package substrate 301.

At step 502, IC package 300 undergoes a reflow process so that IC package 300 is mechanically and electrically connected to PCB 406 by interconnects 108A, 108B, 108C, and 108D. In this step, the reflow is performed to melt interconnects 108A, 108B, 108C, and 108D, so that IC package 300 and PCB 406 are bonded together when the interconnects cool down. During the reflow process, IC package 300 may exhibit a convex warpage behavior in response to thermal heat exposure at reflow.

As IC package 300 is cooled from the reflow temperature to room temperature, IC package 300 may still exhibit a convex warpage behavior at step 503. However, the different arrangements of the different size interconnects 108A, 108B, 108C, and 108D from the center to the corner regions on the bottom surface of package substrate 301 create an optimized and uniform interconnect height between IC package 300 and PCB 406. The optimized and uniform interconnect height between IC package 300 and PCB 406 maintains low interconnect stress and improves interconnect joint yields.

Figure 6:
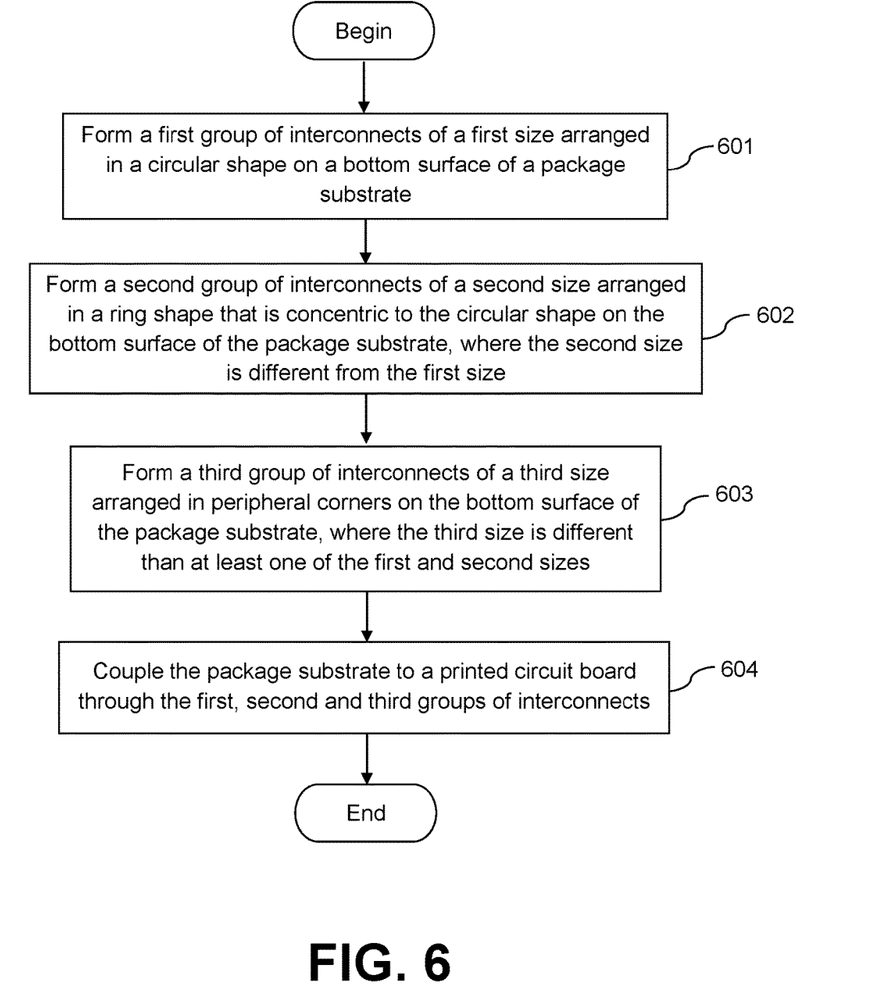
FIG. 6 shows a flow chart of illustrative steps for manufacturing an integrated circuit package having an active warpage control structure in accordance with one embodiment of the present invention.

FIG. 6 shows a flow chart of illustrative steps for manufacturing an integrated circuit (IC) package having an active warpage control structure in accordance with embodiments of the present invention. It should be appreciated that the embodiments of FIGS. 1, 2, 3, 4 and 5 may be used as examples to implement the steps described below.

Typically, a predicted or expected warpage characteristic of an IC package is determined through simulation or analysis based on an understanding of the package materials. The predicted warpage characteristic can then be actively controlled using interconnects of different sizes (or heights) to accommodate the expected warpage. To do so, a first group of interconnects of a first size arranged in a center circular shape on a bottom surface of a package substrate is formed at step 601. For example, as shown in FIGS. 1 and 2, large interconnects such as interconnects 108A are formed in a center circular shape (highlighted in region 102) on the bottom surface of package substrate 101. Alternatively, as shown in FIG. 3, smaller interconnects such as interconnects 108D are formed in a center circular shape (highlighted in region 102) on the bottom surface of package substrate 301.

At step 602, a second group of interconnects of a second size arranged in a ring shape that is concentric to the circular shape on the bottom surface of the package substrate is formed. The second size is different than the first size. For example, as shown in FIGS. 1 and 2, medium interconnects 108B are formed in a ring shape (highlighted in region 104A) on the bottom surface of package substrate 101. The ring shape of interconnects 108B is concentric to the circular shape of interconnects 108A. In one embodiment, interconnects 108B may be larger than interconnects 108A. In another embodiment, interconnects 108B may be smaller than interconnects 108A. If desired, other medium interconnects (e.g., interconnects 108C of FIGS. 1 and 2) may be formed in a ring shape (highlighted in region 104B) on the bottom surface of package substrate 101. The ring shape of interconnects 108C may extend laterally from the ring shape of interconnects 108B and may be concentric to the circular shape of interconnects 108A. In one embodiment, interconnects 108C may be larger than at least one of interconnects 108B. In another embodiment, interconnects 108C may be smaller than interconnects 108B.

At step 603, a third group of interconnects of a third size arranged in peripheral corners on the bottom surface of the package substrate is formed. The third size is different than at least one of the first and second sizes. For example, as shown in FIGS. 1 and 2, interconnects 108D may be arranged in peripheral corner regions (highlighted in regions 106) on the surface of package substrate 101. In one embodiment, interconnects 108D may be larger than at least one of interconnects 108B. In another embodiment, interconnects 108D may be smaller than interconnects 108B.

At step 604, the package substrate is coupled to a printed circuit board through the first, second, and third groups of interconnects. For example, as shown in FIG. 4, package substrate 101 of IC package 200 may be coupled to printed circuit board 406 through interconnects 108A, 108B, 108C, and 108D through a reflow process. In this example, IC package 200 may exhibit a concave warpage characteristic as a result of cooling from reflow to room temperature. The arrangement of the interconnects of different sizes (e.g., large interconnects 108A in region 102, medium interconnects 108B in region 104A, medium interconnects 108C in region 104B, and small interconnects 108D in region 106) on the bottom surface of package substrate 101 creates an optimized and uniform interconnect height between IC package 200 and PCB 406 to maintain low interconnect stress and improve interconnect joint yields.

In another example, as shown in FIG. 5, package substrate 301 of IC package 300 may be coupled to printed circuit board 406 through interconnects 108A, 108B, 108C, and 108D through a reflow process. In this example, IC package 300 may exhibit a convex warpage characteristic as a result of cooling from reflow to room temperature. The arrangement of the interconnects of different sizes (e.g., small interconnects 108D in region 102, medium interconnects 108C in region 104A, medium interconnects 108B in region 104B, and large interconnects 108A in region 106) on the bottom surface of package substrate 301 creates an optimized and uniform interconnect height between IC package 300 and PCB 406 to maintain low interconnect stress and improve interconnect joint yields.

The present exemplary embodiments may be practiced without some or all of these specific details described with reference to the respective embodiments. In other instances, well-known operations have not been described in detail in order not to obscure unnecessarily the present embodiments.

The methods and apparatuses described herein may be incorporated into any suitable circuit. For example, the methods and apparatuses may be incorporated into numerous types of devices such as microprocessors or other integrated circuits. Exemplary integrated circuits include programmable array logic (PAL), programmable logic arrays (PLAs), field programmable logic arrays (FPGAs), electrically programmable logic devices (EPLDs), electrically erasable programmable logic devices (EEPLDs), logic cell arrays (LCAs), field programmable gate arrays (FPGAs), application specific standard products (ASSPs), application specific integrated circuits (ASICs), and microprocessors, just to name a few.

Although the method operations were described in a specific order, it should be understood that other operations may be performed in between described operations, described operations may be adjusted so that they occur at slightly different times or described operations may be distributed in a system which allows the occurrence of the processing operations at various intervals associated with the processing, as long as the processing of the operations are performed in a desired way.

What is claimed is:

1. An integrated circuit package, comprising:
    a package substrate having a surface; and
    first interconnects of a first size that are arranged in a substantially circular shape that is centered on the surface of the package substrate; and
    second interconnects of a second size that is different from the first size, wherein the second interconnects are arranged in a ring shape on the surface of the package substrate, and wherein the ring shape of the second interconnects is concentric with the substantially circular shape of the first interconnects.

2. The integrated circuit package defined in claim 1, wherein the second size is smaller than the first size.

3. The integrated circuit package defined in claim 2, further comprising:
    third interconnects of a third size that is smaller than at least one of the first and second sizes, wherein the third interconnects are arranged in an additional ring shape that extends laterally from the ring shape of the second interconnects on the surface of the package substrate, and wherein the additional ring shape of the third interconnects is concentric with the substantially circular shape of the first interconnects.

4. The integrated circuit package defined in claim 3, further comprising:
    fourth interconnects of a fourth size that is smaller than the third size, wherein the fourth interconnects are arranged in peripheral corner regions on the surface of the package substrate.

5. The integrated circuit package defined in claim 2, further comprising:
    third interconnects of a third size that is smaller than at least one of the first and second sizes, wherein the third interconnects are arranged in peripheral corner regions on the surface of the package substrate.

6. The integrated circuit package defined in claim 1, wherein the surface of the package substrate has a warpage.

7. The integrated circuit package defined in claim 1, further comprising:
    an integrated circuit die attached to the surface of the package substrate.

8. The integrated circuit package defined in claim 1, wherein each interconnect of the first and second interconnects actively controls warpage of the package substrate during a reflow process of the integrated circuit package.

9. An integrated circuit package, comprising:
- a package substrate having a top surface and a bottom surface;
- a first array of interconnects disposed in a first ring-shaped region on the bottom surface of the package substrate, wherein each interconnect of the first array of interconnects has a first height; and
- a second array of interconnects disposed in a second ring-shaped region on the bottom surface of the package substrate, wherein the second ring-shaped region surrounds the first ring-shaped region, and wherein each interconnect of the second array of interconnects has a second height that is different from the first height.

10. The integrated circuit package defined in claim 9, wherein each interconnect of the first and second arrays of interconnects comprises solder balls.

11. The integrated circuit package defined in claim 9, wherein the second height is smaller than the first height.

12. The integrated circuit package defined in claim 9, further comprising:
- a third array of interconnects disposed in a center circular region on the bottom surface of the package substrate, wherein the first and second ring-shaped regions are concentric to the center circular region, and wherein each interconnect of the third array of interconnects has a third height that is different from at least one of the first and second heights.

13. The integrated circuit package defined in claim 12, further comprising:
- a fourth array of interconnects of a fourth height that is smaller than the second height, wherein the fourth array of interconnects are arranged in peripheral corner regions on the bottom surface of the package substrate.

14. The integrated circuit package defined in claim 9, further comprising:
- an integrated circuit die attached to the top surface of the package substrate opposite the bottom surface of the package substrate.

15. The integrated circuit package defined in claim 9, wherein each interconnect of the first and second arrays of interconnects actively controls warpage of the package substrate during a reflow process of the integrated circuit package.

16. A method of manufacturing an integrated circuit package, the method comprising:
- forming a first plurality of interconnects arranged in a circular shape on a bottom surface of a package substrate, wherein each interconnect in the first plurality of interconnects has a first size; and
- forming a second plurality of interconnects arranged in a ring shape on the bottom surface of the package substrate, wherein the ring shape is concentric to the circular shape, and wherein each interconnect in the second plurality of interconnects has a second size that is different from the first size.

17. The method defined in claim 16, further comprising:
- mounting the integrated circuit package on a printed circuit board, wherein the integrated circuit package is electrically coupled to the printed circuit board through the first and second pluralities of interconnects.

18. The method defined in claim 17, wherein each interconnect of the first and second pluralities of interconnects actively controls warpage that occurs between the package substrate and the printed circuit board during a reflow process on the integrated circuit package.

19. The method defined in claim 16, further comprising:
- forming a third plurality of interconnects arranged in peripheral corners of the bottom surface of the package substrate, wherein each interconnect in the third plurality of interconnects has a third size that is different from at least one of the first and second sizes.

20. The method defined in claim 16, further comprising:
- forming a third plurality of interconnects arranged in an additional ring shape on the bottom surface of the package substrate, wherein the additional ring shape is concentric to the circular shape and surrounds the ring shape, and wherein each interconnect in the third plurality of interconnects has a third size that is different from at least one of the first and second sizes.

* * * * *